United States Patent [19]

Brandolino et al.

[11] Patent Number: 5,670,882

[45] Date of Patent: Sep. 23, 1997

[54] FERROUS TARGET IDENTIFICATION SYSTEM WITH MAGNETIC FIELD POLARITY AND GRADIENT INDICATION

[75] Inventors: Giuseppe Brandolino, Brampton; Fred Maroske, Thornhill, both of Canada

[73] Assignee: Magnawand Inc., Concord, Canada

[21] Appl. No.: 531,676

[22] Filed: Sep. 21, 1995

[51] Int. Cl.$^6$ ............................ G01V 3/08; G01V 3/165; G01V 3/40
[52] U.S. Cl. ............................ 324/345; 324/326
[58] Field of Search ............................ 324/67, 326–329, 324/345, 247, 253–255

[56] References Cited

U.S. PATENT DOCUMENTS

| | | | |
|---|---|---|---|
| 3,757,501 | 9/1973 | Bennett, Jr. et al. | 324/326 X |
| 3,781,664 | 12/1973 | Rorden | 324/247 |
| 4,021,725 | 5/1977 | Kirkland | 324/345 X |
| 4,068,164 | 1/1978 | Schwartz et al. | 324/253 X |
| 4,427,942 | 1/1984 | Sole | 324/67 X |
| 4,439,732 | 3/1984 | Hesterman et al. | 324/345 X |
| 5,321,361 | 6/1994 | Goodman | 324/326 |

*Primary Examiner*—Gerard R. Strecker
*Attorney, Agent, or Firm*—Bereskin & Parr

[57] ABSTRACT

A target identification system for detecting a desired ferrous object concealed beneath a surface is provided for a gradiometer. The system has first and second sensors for detecting a magnetic field at a first and second points above the surface. A device for providing drive signals for the sensors is connected to the sensors, to generate sensor output signals proportional to the magnetic fields sensed by the sensors. The outputs of the sensors are connected to means for generating a difference signal at an output thereof, the difference signal being the difference between the output signals of the sensors and being proportional to the detected gradient of the magnetic field between the first and second points. An interface receives the difference signal for producing an indication signal when said magnetic field has a selected polarity and when the magnitude of the detected magnetic field gradient exceeds a set value. For example, the interface can comprise a pair of LEDs, for the two different polarities, which are only activated if a threshold is exceeded. This enables a user to distinguish unwanted objects which typically will show an opposite polarity from target objects.

22 Claims, 5 Drawing Sheets

FERROUS TARGET IDENTIFICATION SYSTEM WITH MAGNETIC FIELD POLARITY AND GRADIENT INDICATION

FIELD OF THE INVENTION

This invention relates to a system for locating ferrous objects concealed beneath a surface, and in particular, relates to a system which provides a positive identification of a desired target object and which rejects an undesired, or "garbage" ferrous object.

BACKGROUND OF THE INVENTION

Objects which are concealed underground cause particular concern for persons digging in the area. Often, an object, such as a surveyor's post, is desired to be located and removed. It is time-consuming, inefficient and expensive to make repeated attempts to excavate the object, if only an approximate location is known and the object is not unearthed on the first attempt. Therefore, what is required is some method of determining the location of an object buried beneath the surface before digging to remove or replace the object.

Many utility companies have a need to locate gas and water pipes and the like for repair and maintenance. Often, these need to be located in the gardens or backyards of individual houses, where any landscape damage caused by digging must be satisfactorily repaired.

Magnetic gradiometers, known in the art, are often used to determine the location of a ferrous metal object concealed beneath the earth's surface. The signal generated by a standard gradiometer is usually a representation of the magnetic gradient using two sensors to detect the magnetic field at two points in space.

Ferrous objects located beneath the earth's surface will become magnetised and will create an observable interruption in the earth's static magnetic field, causing a deviation in the gradient of the magnetic field surrounding the object. These deviations can be detected in the magnetic field as one traverses across and above the earth's surface and through the field. Thus, deviations in the magnetic field observed on the earth's surface are indications that ferrous objects are located directly below the peak of the disturbance in the magnetic field.

Each positive and negative signal generated by a gradiometer is actually a difference signal representing the difference in magnetic field between two sensors, with the value of an upper sensor being subtracted from the value of a lower sensor. This difference signal can be used to indicate both the polarity and the gradient of the magnetic field at the particular position on the earth's surface, although often only the magnitude of the gradient is indicated. A gradiometer must have some mechanism to provide feedback or interface to the user to indicate the field gradient detected and hence to indicate when an object is detected. The most common method of indicating the presence of a ferrous object is by providing an audible tone whose pitch increases as the magnetic field gradient increases. Many commercial gradiometers have a speaker or a set of headphones which output an audible tone with a variable pitch, where the pitch increases as the magnetic field increases. Thus, when the instrument approaches a ferrous object, the tone will steadily increase and peak directly over the target object. Since the human ear is very sensitive to pitch change, the user can easily detect changes in the gradient. However, when the instrument is set to a high sensitivity setting to locate weak signals, the pitch changes often and rapidly, and is therefore difficult to interpret and can be very aggravating.

A less common alternative to variable pitch is using an audible tone with a fixed pitch but increasing volume as the magnetic field increase. This method works very well when searching for large objects buried fairly close to the surface. Since the human ear is not as sensitive to changes in volume as it is to changes in pitch, high sensitivity settings can be used. However, it is difficult to pinpoint targets with the increasing volume method. Weak signals are hard to identify and the method is not practical in loud ambient noise areas. Other potential feedback mechanisms include flashing lights, audible beeps, and vibration feedback, all varying with signal strength.

A principal difficulty with the gradiometers discussed above, regardless of which method of feedback is used, is that there is no way to distinguish between desired targets and scrap metal, such as rusting cans or discarded implements. Much time and effort may be wasted locating and digging to unearth these "garbage" objects. The methods of feedback of the magnetic field discussed above, are indications of the signal strength alone. Signal strength is not determinative of the depth or size of the object as a large object buried deep may show the same strength as a small object buried close to the surface. None of the feedback methods discussed above give any indication of the gradiometer's signal polarity thus giving no indication of the magnetic field's polarity. Yet the signal's polarity may be an indication of whether the object is a desired target object or whether it is scrap material.

Some gradiometers employ a meter or bar graph display to indicate signal strength. It is possible to observe the polarity of the signal if the meter display is bipolar. However, to use the signal polarity to identify a target one must continually monitor the meter display, and this requires a reasonably sophisticated interpretation of the display. It is difficult to continuously monitor the meter while at the same time walking about the surface and listening for changes in pitch. Attempting to watch the meter for polarity changes which may be abrupt is distracting and dangerous as the user may be so intent on observing the meter, that he or she is unable to properly watch for hazards in the environment.

Therefore, what is needed in the art is a system which can provide a positive identification of desired or undesired objects. Such a system should advantageously provide some mechanism to indicate whether the object is a desired one or not without interfering with the means for indicating field strength.

SUMMARY OF THE INVENTION

Accordingly, it is desirable to provide a system which can identify desired objects concealed beneath a surface and which can distinguish desired objects from undesired objects.

More particularly, the interface with the user preferably provides a clear indication, distinguishing between the typical characteristics of desired and undesired objects, without requiring the user to make a complex interpretation of a visual or other display.

In accordance with the present invention, there is provided a target identification system for a gradiometer for detecting a desired ferrous object concealed beneath a surface, said system comprising:

(a) a first sensor for detecting a magnetic field at a first point above the surface;

(b) a second sensor for detecting said magnetic field at a second point above the surface, said second point located above said first point;

(c) means for providing drive signals for the sensors, connected to the first and second sensors, to generate sensor output signals proportional to the magnetic fields sensed by the sensors;

(d) circuit means connected to the first and second sensors and including means for generating a difference signal at an output thereof, said difference signal being the difference between the output signals of the sensors and being proportional to the detected gradient of the magnetic field between said first point and said second point, the circuit means also generating a polarity signal indicative of the magnetic field polarity at the tip sensor; and (e) interface means for producing an indication signal when both said polarity signal has a selected polarity indicative that said magnetic field has a selected polarity and said difference signal has a magnitude that exceeds a set value, indicative that the magnitude of the detected magnetic field gradient exceeds a set value, the interface means being connected to the circuit means.

Preferably, the interface means varies a characteristic of the indication signal in proportion to the detected magnitude of the magnetic field gradient to provide an indication of the magnitude of the magnetic field gradient.

The interface means can comprise a single transducer adapted to provide an indication signal for either polarity of the detected magnetic field, wherein the single transducer is activated to generate a first indication signal for one polarity and a second indication signal for the other polarity, to indicate the polarity of the magnetic field gradient when the magnetic field gradient exceeds the set value. The first and second indication signals can then have respective first and second different frequencies, to indicate the polarity.

Advantageously, the interface means additionally provides an indication of the magnitude of the detected magnetic field gradient. For this purpose, the amplitude of the first and second indication signals can be varied in proportion to the magnitude of the detected magnetic field gradient to provide an indication of the magnitude thereof.

In one embodiment of the present invention, the amplitude of the first and second indication signals is varied, to indicate the magnitude of the magnetic field gradient when the magnetic field gradient does not exceed the set value or when the magnetic field has one polarity, and when the magnetic field has the other polarity and has a magnitude exceeding the set value, an indication signal is given which varies in frequency to indicate the magnitude of the detected magnetic field gradient.

Preferably, the first and second indication signals are intermittent and oscillate between on and off states, the rate of oscillation being indicative of the magnitude of the detected magnetic field gradient.

In another embodiment of the invention, the indicating means is adapted to provide an indication that the magnitude of the detected magnetic field gradient exceeds the set value for either polarity, and the interface means comprises one transducer for indicating the magnetic field gradient of one polarity and another transducer for indicating the magnetic field gradient of the other polarity, each transducer being activated to produce an indication signal, when the magnetic field gradient has the required polarity and exceeds the set value. The transducers may be audio speakers, or LEDs or other sources or means of illumination.

Preferably, the interface means includes an auxiliary input, for a signal indicative of the polarity of the magnetic field gradient, which auxiliary input is connected to the output of the first sensor. This then avoids false indications of polarity, when this is determined from the polarity of the difference signal. Advantageously, the interface means then includes comparison means having one input for a threshold level for one polarity and another input for a threshold level of the other polarity, a threshold comparator having an input connected to the output of the means for generating a difference signal and another input, and a decision block for selectively connecting the other input of the threshold comparator to one of said threshold inputs, the decision block being controlled by the auxiliary input to the interface means.

Preferably, the transducers are illumination means and the system includes an oscillator means connected between the output of the means for generating a difference signal and at least one of the first and second illumination means, the oscillator means providing an oscillating signal for causing the transducer to oscillate between on and off states. More preferably, the frequency of the oscillator varies depending upon the output of the means for generating a difference signal, whereby the magnitude of the detected magnetic field gradient is indicated by the rate of oscillation.

DESCRIPTION OF THE PREFERRED EMBODIMENT

Figure 1:
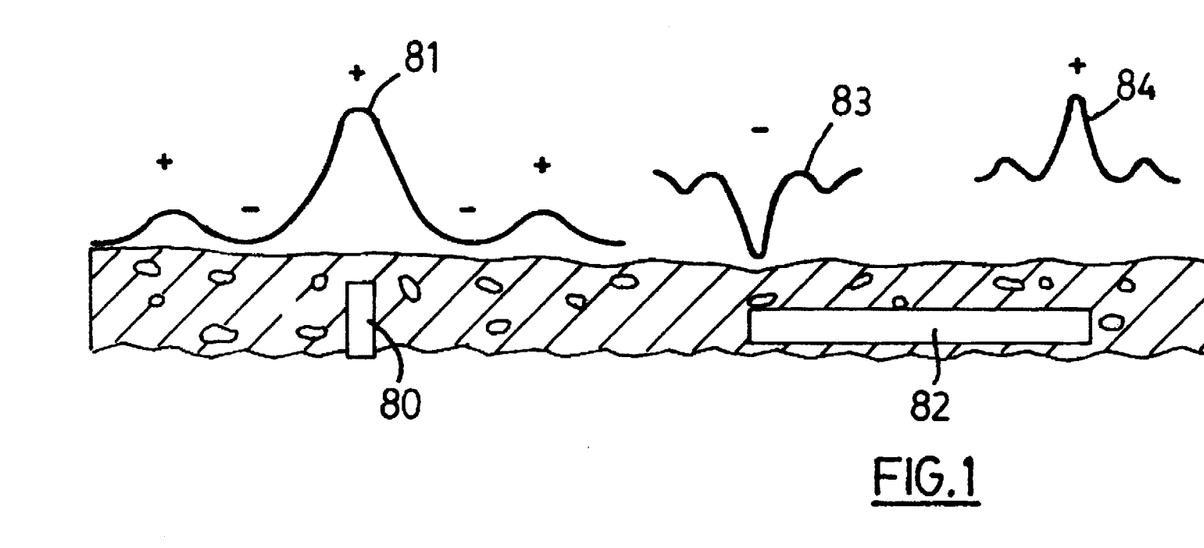
FIG. 1 is a schematic illustrating the signal polarity pattern for a vertical target and for a horizontal target.

Referring now to FIG. 1, the characteristic polarity pattern of a vertically aligned object 80 and a horizontally aligned object 82 are illustrated. As shown, the vertically aligned object 80 will yield only a positive polarity field 81, while a horizontally buried object 82 yields a transition from a negative field 83 to a positive field 84. These patterns are true for the Northern hemisphere only; polarity is reversed in the Southern hemisphere. For simplicity, the following discussion relates solely to magnetic field patterns in the northern hemisphere, and it will be appreciated that references to positive and negative polarity etc. need to be reversed for the southern hemisphere.

It is the characteristic polarity patterns of vertically aligned objects and horizontally aligned objects which form the basis for determining whether an object is a desired object or an undesired object in the present invention. Desired objects are generally vertically aligned. For example, a surveyor's rod is sunk vertically with some deliberation. In contrast, most garbage or scrap objects buried beneath the surface are horizontally aligned since such objects are usually cast aside, or thrown or laid down and then forgotten.

Figure 2:
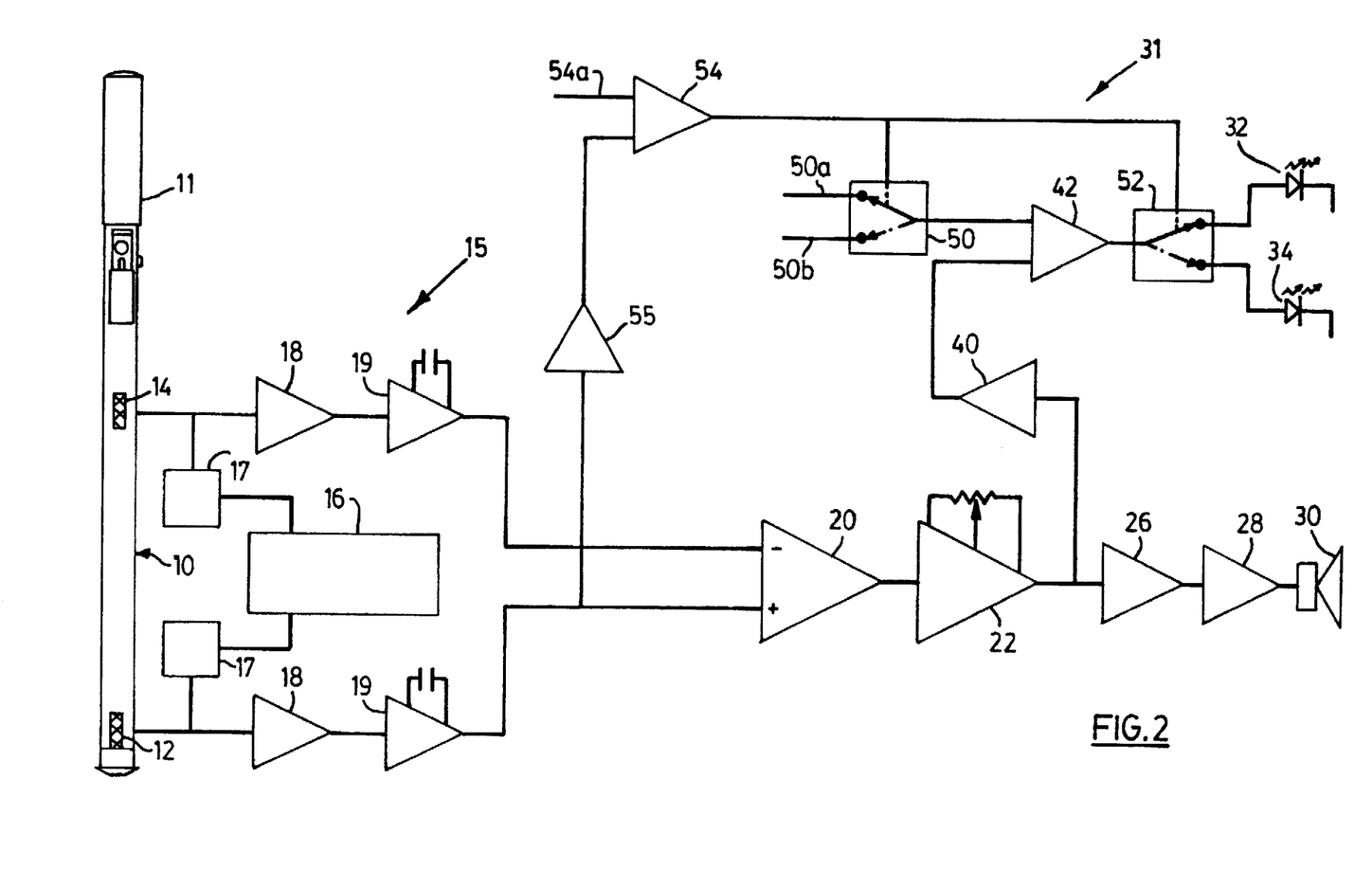
FIG. 2 is a schematic of one embodiment of a target identification system in accordance with the present invention.

Referring now to FIG. 2, a first embodiment of a target identification system is shown. The system has a housing 10 which includes a first sensor 12 located adjacent the tip of the housing 10 and a second sensor 14 located nearer the top of the housing 10. The sensors 12, 14 detect magnetic fields at their respective points. The sensors 12, 14 respond to the varying magnetic field surrounding the concealed object. Each sensor produces a signal proportional to the magnetic field strength measured at its respective point in space.

Control and drive circuitry 15 includes a sensor excitation control unit 16 which is connected to respective sensor drive blocks or units 17 which in turn are connected to the two sensors 12, 14 to drive them. The sensors 12, 14 in known manner, are electromagnetic coils suitably configured to measure variations in the earth's magnetic field.

The outputs from the sensors 12, 14 are connected to respective amplifiers or sensor read units 18, whose outputs in turn are connected to respective sensor filtering and condition units 19. The outputs from the sensor filtering and condition units 19 are connected to a differential amplifier 20 whose output is representative of the difference in magnetic field sensed by the sensors 12, 14 and hence proportional to the local gradient in magnetic field as detected by the sensors.

The first sensor 12 produces a first output signal Vtip and the second sensor 14 produces a second output signal Vtop. The output signals are connected to the differential amplifier 20 which subtracts the voltage output of the second sensor 14 from the voltage output of the first sensor 12 to produce a difference signal $$Vdiff = Vtip - Vtop$$

Vdiff is a representation of and is proportional to the gradient of the magnetic field.

Vdiff is amplified by a main adjustable amplifier 22 which provides sensitivity control. The sensitivity is set so that a certain range of signals may be detected. A low gain sensitivity will amplify Vdiff a small amount, thus a wider range of large signals may be detected. A high gain sensitivity setting will amplify Vdiff a larger amount so that the system will be more sensitive to smaller changes, but the range of signals that may be detected will be more limited. VCOin represents the amplified and conditioned Vdiff outputted from the adjustable amplifier 22.

VCOin is fed into a voltage controlled oscillator (VCO) 26 which transmits an output signal having a frequency dependent on VCOin to an audio amplifier 28. The output signal is amplified in the amplifier 28 and fed to an audio speaker 30. The audio speaker 30 produces an audible tone. The magnitude of VCOin controls the pitch of the audible tone so that as VCOin increases, the pitch of the audible tone increases.

The audio speaker 30 provides a first indicating or interface means for interfacing the magnitude of magnetic fields encountered as the user moves across a surface. The audible tone outputted by the speaker 30 has a pitch level proportional to the relative strength of the magnetic field gradient encountered (because VCOin is proportional to the magnitude of the magnetic field gradient). Therefore, as a user approaches an object, the pitch of the tone will increase steadily and peak directly over the object.

The first interface means, the speaker 30, only yields an indication of the magnitude of the gradient of the magnetic field, and it does not indicate the field's polarity. When a short horizontally aligned object is encountered, such as a scrap rusting can, the positive and negative signals are approximately equal and the transition from one to another is fairly abrupt. For this reason, the first indicating means will detect the horizontal object as one strong signal.

Therefore, a second interface or indicating means 31 is provided to indicate the polarity of the magnetic field to the user and to distinguish desired objects, which are aligned vertically, from undesired objects, which are aligned horizontally. A positive polarity indication without a negative indication in the vicinity will signify a desired object, whereas a negative polarity indication will signify an undesired object.

The second indicating means 31 includes two states which are indicated by two Light Emitting Diodes or LEDs, a first LED 32 which is of a red colour, and a second LED 34 which is of a green colour. The red LED 32 is illuminated to indicate that the magnetic field has a positive polarity while the green LED light 34 is used to indicate that the magnetic field has a negative polarity.

The polarity of the first output signal, Vtip, from the first sensor 12 is used to determine the polarity (or polarities) of the magnetic field produced by the concealed object.

The first sensor 12 is closest to the concealed object. Therefore the polarity of its signal, the polarity of Vtip, gives a more accurate indication of the polarity of the magnetic field of the target object.

Some systems in the prior art use the polarity of Vdiff to indicate the polarity of the field. However, there are some cases where the polarity of Vdiff is opposite to that of the magnetic field and thus using Vdiff will yield a false indication. This occurs when the system is being used adjacent an above-ground ferrous object which will have its own magnetic field and corresponding polarity which is larger than that detected by the tip sensor 12. For example, if both sensors detected a negative field, but the top sensor 14 detects a large signal, the subtraction in the differential amplifier 20 will give an erroneous positive signal; similarly if both sensors detect a positive field and the top sensor 14 again detects the larger field, the amplifier 20 will give an erroneous negative indication. Using the signal from Vtip to govern polarity avoids the hazards of interference from above-ground objects.

One aspect of the present invention is to include preset threshold values for the two states of the second interface means 31, the red LED 32 and the green LED 34. The threshold values are chosen so that the LEDs are not activated unless and until the magnitude of Vdiff equals or exceeds the respective threshold value. Without implementing the threshold, either of the LED indicators 32 and 34 would be on almost constantly. If the LED indicators were on constantly, eventually the user would tend to ignore them. Implementing the thresholds protects against indication from weak signals and encourages positive target identification only when a magnetic field of relatively high magnitude is encountered, indicating the location of a concealed object. The thresholds can either be fixed or the device can include a control enabling the user to adjust the thresholds.

An absolute value amplifier 40 measures the magnitude of VCOin. The output from the absolute value amplifier 40 is fed into a voltage comparator 42. The voltage comparator 42 compares the absolute value of the VCOin voltage to the pre-set threshold levels. A decision or switch block 50 enables a selection to be made between a positive threshold reference 50a and a negative threshold reference 50b, which can be set in known manner. The decision between positive and negative thresholds in the switch block 50 is dependent on the polarity of the first signal produced by the first or tip sensor 12.

To account for the earth's magnetic field, a qualifier threshold comparator 54 is used. The output of the first sensor 12 is compared by the qualifier threshold comparator 54 to a value input at 54a representing the level expected from background noise, including that of the earth's magnetic field. The comparison is made with the magnitude of Vtip, irrespective of its polarity.

The qualified signal will have a polarity representing the polarity of the magnetic field of the target object, which will in turn activate or switch the decision block 50 and another decision block 52 to negative or positive as the case may be.

In decision block 50, the positive threshold reference 50a will govern if the polarity of the qualified first signal is positive and the negative reference 50b set if the polarity of the qualified first signal is negative. In the decision block 52, the red LED indicator 32 will be activated when the polarity of the qualified signal is positive while the green LED indicator 34 will be activated when the polarity of the qualified signal is negative.

In this manner, the red and green LED indicators 32, 34 provide information on two states. One state is established by the red LED indicator 32, indicating a positive field polarity and therefore a desired target object (provided no green LED indications occur in the immediate vicinity). The other state is established by the green LED indicator, indicating a negative polarity and therefore an undesired target object.

The addition of threshold levels provides information on a third state of the interface means where no information is being given. This third state indicates to the user that no object has been found and the user should therefore keep searching.

It is possible to set the threshold levels for negative and positive at equal levels. However, a buried piece of ferrous metal which is not quite horizontal will have a strong positive signal and a weaker negative signal. This is due to the earth's static field magnetising the object in its own direction. Thus the part of the object located closer to the surface will be the positive signal (since it is the exit point for the Earth's influencing field lines) and the part of the object located farther from the surface will be the negative signal (since it is the entry point for the Earth's field lines). Again, these polarities will be reversed in the Southern hemisphere.

Thus the part of the object which is closest to the surface will be detected more strongly than the negative part which is buried more deeply. Therefore, it is preferable to have the negative threshold level set at a lower level than the positive threshold.

Reference will now be made to other Figures, which show variant embodiments of the present invention. For simplicity, like components are given the same reference numerals, and a description of these components is not repeated.

Figure 3:
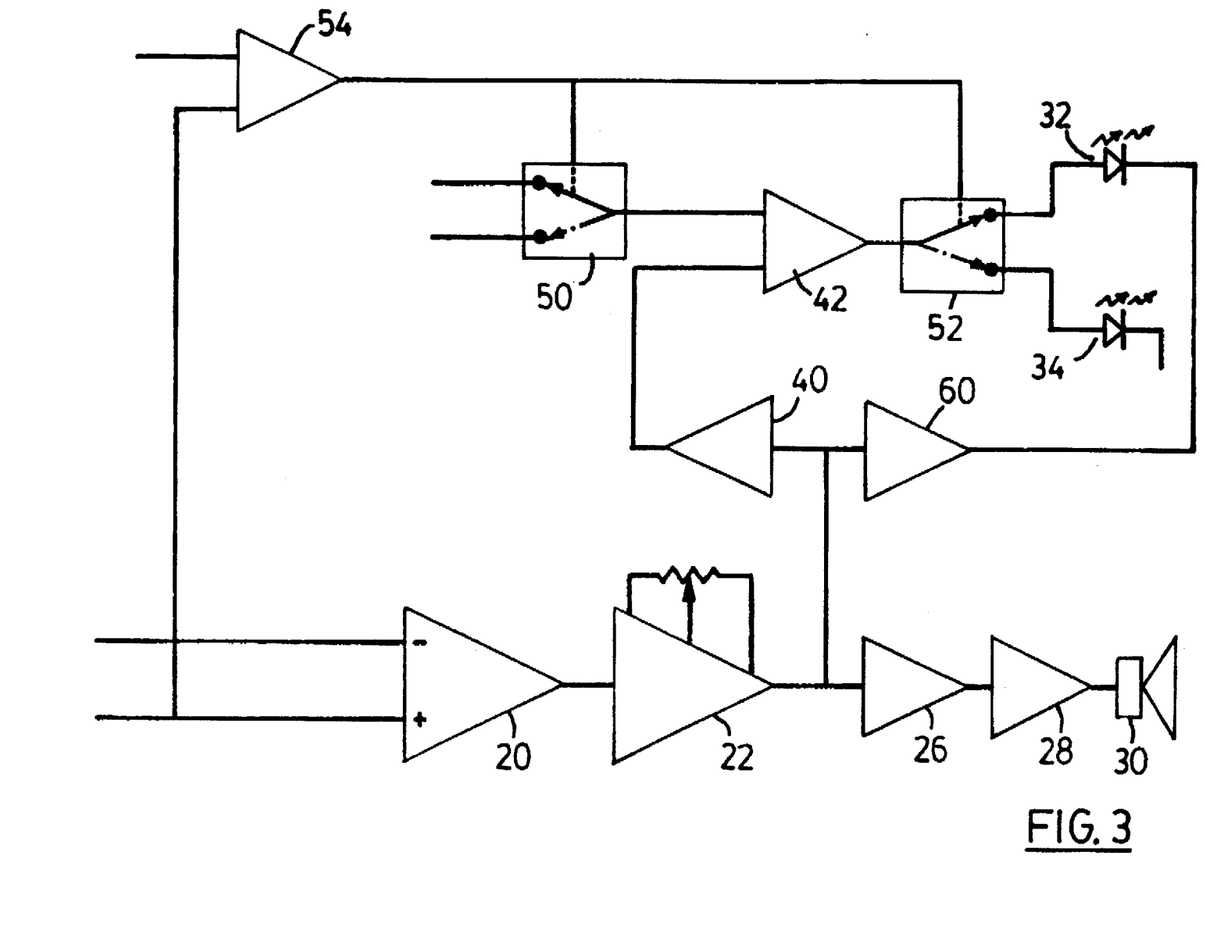
FIG. 3 is a schematic of a second embodiment of the target identification system in accordance with the present invention.

Referring first to FIG. 3, this shows the part of the circuitry, commencing at the differential amplifier 20. It broadly corresponds to the circuit of FIG. 2. An additional voltage controlled oscillator (VCO) 60 is provided, connected between the output of the main adjustable amplifier 22 and the red LED 32.

This VCO 60 modulates the red LED at a low frequency visible to a user, i.e. much lower than the modulation frequency used for the audio output. In short, the LED 32 will flash at a rate proportional to the signal strength, so as to give a qualitative indication of the signal strength, in a manner similar to a meter. This is analogous to the VCO 26 driving the speaker 30, but at a lower frequency, the signal strength being proportional to the flashing rate of the LED. It has been found that frequencies in the range of 1–50 Hz are practical.

Thus, in this implementation, the green LED 34 will illuminate solidly when the signal is negative and above the preset negative threshold 50b. The red LED 32 will flash at a rate proportional to the signal strength when the signal is above the positive threshold 50a. Both cases also require the signal sensed by the tip sensor 12 to meet the threshold setting 54a.

A visual display other than the LEDs 32, 34 can be provided. A screen comprising a plurality of pixels, for example a colour video screen, could be provided. When a detected signal is below a threshold, indicative of no significant target in the vicinity, the screen would be blank or alternatively made to default to some logo or some other information. When a negative signal is detected, the screen would display an image of an analogue meter (or a multi-digit numeric display) indicating the signal strength. The predominant or background color would be green. When a positive signal is detected, the video screen would again display the analogue meter or multi-digit numeric display, but the predominant or background color would be red (it will be appreciated that the chosen colors green and red are largely arbitrary, although they do have some standard significance; any suitable pair of colors can be chosen). This display has the advantage of having the threshold value again tied to the tip sensor polarity, and also giving the go/no go (red/green) indication, with the added feature of giving the signal strength for both conditions.

The signal strength indication is useful for many reasons. Firstly, it can be a replacement for an analogue meter, with the added benefit of being out of sight or invisible when no significant targets are detected. The user can pinpoint the edge of a target by observing the flashing LED (or analogue or digital display) and watching for the highest signal strength. This is expected to be particularly useful in noisy search areas.

It has been found in practice that just providing the flashing indication, i.e. the signal strength indication for the red LED is most effective. The negative indicator, the green LED 34, need simply illuminate when the magnitude of the detected signal is greater than the negative signal threshold, since all the user needs to know is that this is not a suitable target.

The flashing of the positive indicator, the red LED 32 has two main functions, namely: the user is more likely to want to pinpoint the positive signal because a desirable target objectively possesses a positive signal in the northern hemisphere; and flashing of the positive indicator reinforces the signal to user that this is the LED which is significant and indicative of the desired target. It will be appreciated that the user will be simultaneously controlling and watching the path of the tip of the device, and watching the LEDs 32, 34. Knowing the LED 32 will flash when a positive target is reached, will enable a user to watch the LED 32 out of the corner of their eye, or in their peripheral vision field. When a user detects that the LED 32 is flashing, then greater attention can be paid to it, to detect the maximum field found.

It will also be appreciated by those skilled in the art that a switch arrangement can be provided that allows an operator to switch between different characteristics. Thus, with reference to the VCO 60 in FIG. 3, a switch arrangement can be provided that would allow one of the following modes of operation: both positive and negative indicators, i.e. both LEDs 32 and 34, to illuminate continuously when the appropriate threshold is exceeded; both positive and negative indicators 32 and 34 to flash at a rate proportional to the signal strength, as determined by a VCO 60 or the like, when the respective threshold is exceeded; or just the positive indicator to flash proportional to the signal strength when the positive threshold is exceeded and the negative indicator 34 to illuminate solidly when the negative threshold is exceeded (the arrangement of FIG. 3).

Figure 4:
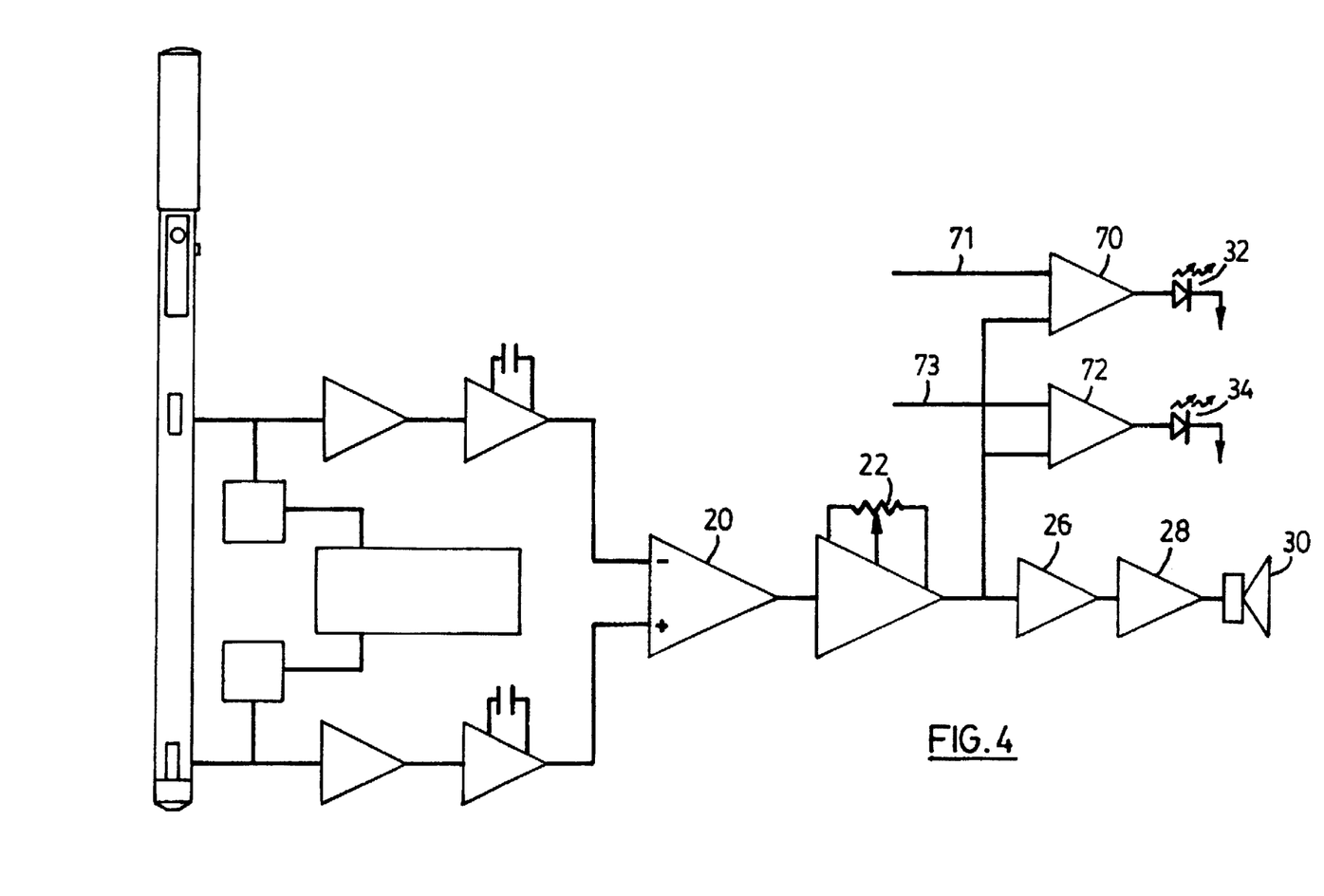
FIG. 4 is a schematic of a third embodiment of the target identification system in accordance with the present invention.

Reference will now be made to FIG. 4 which shows a variant embodiment of the present invention. Here, the decision blocks 50, 52 and the qualification comparator 54 are omitted. Instead, a feed is taken from the output of the main adjustable amplifier 22, so as to have a signal that has been gain adjusted by the amplifier 22, as for the earlier embodiments. This signal is fed directly to the inputs of two threshold comparators 70, 72. The first or positive comparator 70 has an input 71 for a positive threshold reference and is connected to and controls the red or positive LED 32. Correspondingly, the second or negative comparator 72 has a negative threshold input 73 and is connected to and controls a green or negative LED 34.

This arrangement has the advantage of being simpler and more economic to implement. It has the disadvantage that the qualification comparator 54 is omitted. Hence, there is a possibility of an erroneous indication being given for certain situations mentioned above. In particular, where the top sensor experiences a strong signal that is greater than the signal sensed by the tip sensor, an erroneous indication can be given. If both sensors give a negative output, but the output from the top sensor is of greater magnitude, then the differential amplifier 20 will give a positive output erroneously suggesting that the tip sensor has detected a field with positive polarity; correspondingly, if both sensors detect a positive field, but again the top sensor 14 detects a larger signal, the differential amplifier will have negative output which will erroneously suggest that the tip sensor has detected a field of negative polarity.

In another embodiment of the present invention, the second indicating means may be provided by a vibrating mechanism on the, handle 11 of the housing 10. The vibrating mechanism is adapted to vibrate at one frequency corresponding to the first state of the second indicating means and would vibrate at a second, distinct, frequency, corresponding to the second state of the second indicating means. The amplitude of vibration can be varied to indicate the magnitude of the detected gradient.

A further alternative embodiment includes a modulating tone, produced through the speaker 30 which provides the second indicating means 31. The modulating tone would repeat at one frequency to indicate the first state or positive polarity of the second indicating means and would repeat at another, distinct and distinguishable frequency indicating the second state or negative polarity of the second indicating means. This technique has proved effective with a high frequency of 1.5 kHz to indicate positive polarity and a low frequency of 100 Hz to indicate negative polarity with a repetition rate of approximately 2 Hz.

Figure 5:
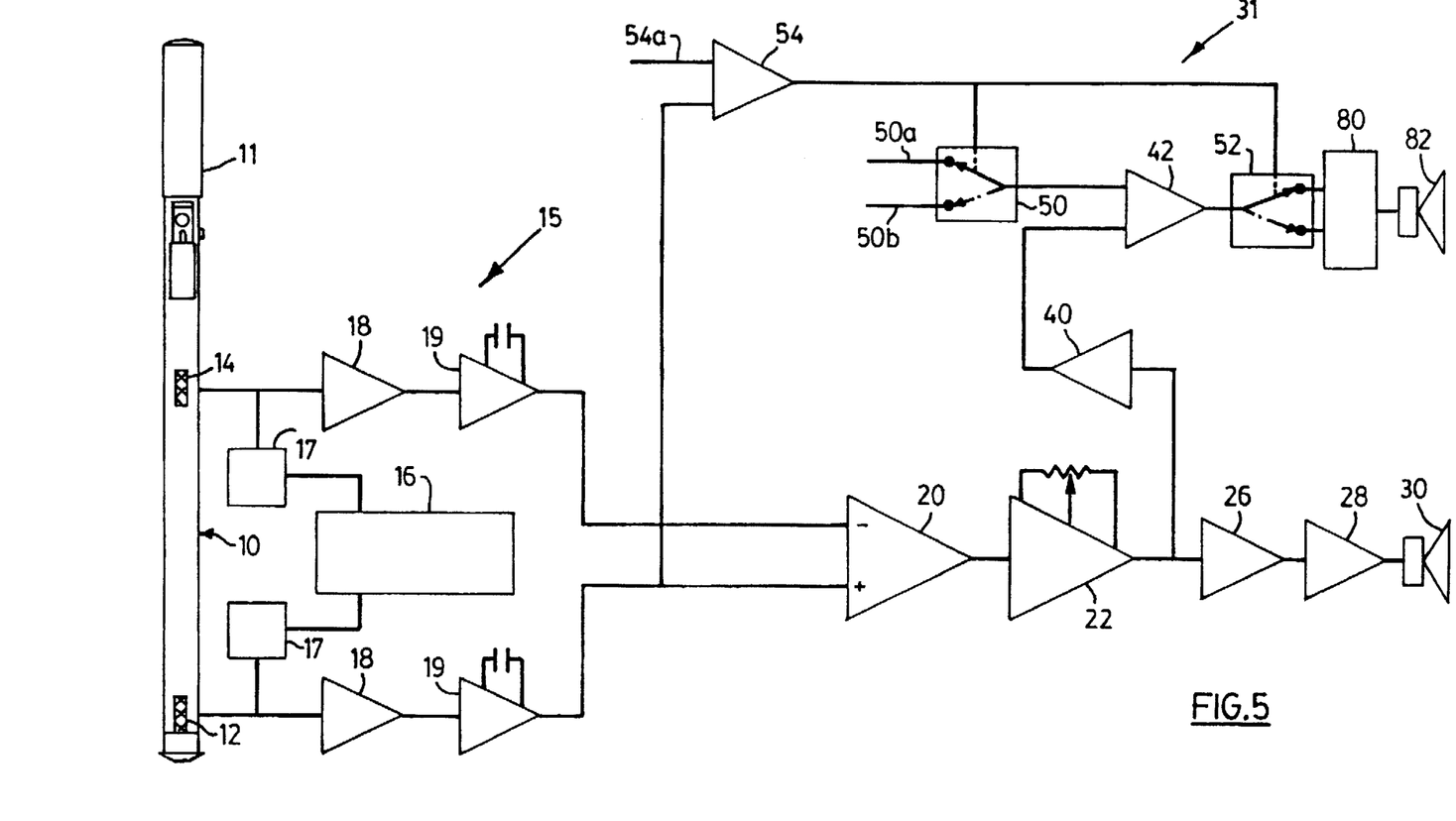
FIG. 5 is a schematic of a fourth embodiment of the target identification system in accordance with the present invention.

This alternative embodiment is shown schematically in FIG. 5, and for simplicity, like components are given the same reference numeral and only the description of the different components are given. Here, a modulating tone generating means 80 is connected to both outputs of the decision block 52, and has an output connected to a speaker 82. The generating means 80 generates a tone at one frequency when a signal is received at one input, and a tone at another frequency when a signal is received at the other input. Thus, this arrangement shows that the user hears different frequencies, indicative of north and south poles as detected by the tip sensor.

It will be appreciated that the use of either LED's, analogue or digital meters, whether actually present or represented on a screen, or an audio output are all examples of different transducers. The essential requirement is to provide a transducer that will convert the electrical signal in the circuit to a signal that can be received by the user to provide the necessary information. In the present case, this requires indicating to the user whether a threshold has been exceeded and the polarity of the signal, and it may optionally include an indication as to the magnitude of the magnetic field gradient. This is provided in addition to, or instead of the conventional audio signal from the speaker or transducer 30.

Other different transducers or indicating arrangements can be provided. For example, an audio signal can be provided by way of "beepers" or the like, with different frequencies being used to indicate the different polarities. The volume could be varied as an indication of the signal strength. This method may be difficult to use in noisy search areas.

Where LED's or other light sources are used, these can be turned on continuously when the respective thresholds are exceeded, but have the intensity varied to indicate signal strength. This technique is analogous to the variable volume method, and may be impractical in daylight or other situations with high ambient light levels.

Another technique is to change the mode of operation of the speaker or transducer 30. A fixed pitch would be used with increasing volume whenever the detected signal is below the threshold and when the signal is negative. When a positive signal above the threshold is detected, the output would switch to the standard or conventional increasing pitch mode, so as to provide a clear indication to a user that a likely target has been found.

Although the above description constitutes the preferred embodiments it will be appreciated that the present invention is susceptible to modification and change without departing from the fair meaning and proper scope of the accompanying claims.

We claim:

1. A target identification system for a gradiometer for detecting a desired ferrous object concealed beneath a surface, said system comprising:

(a) a first sensor for detecting a magnetic field at a first point above the surface;

(b) a second sensor for detecting said magnetic field at a second point above the surface, said second point located above said first point;

(c) means for providing drive signals for the sensors, connected the first and second sensors, to generate sensor output signals proportional to the magnetic fields sensed by the sensors;

(d) circuit means connected to the first and second sensors and including means for generating a difference signal at an output thereof, said difference signal being the difference between the output signals of the sensors and being proportional to the detected gradient of the magnetic field between said first point and said second point, the circuit means also generating a polarity signal indicative of the magnetic field polarity at the first sensor; and (e) interface means for producing an indication signal when both said polarity signal has a selected value, indicative that said magnetic field has a selected polarity and when said difference signal has a magnitude that exceeds a set value, indicative that the magnitude of the detected magnetic field gradient exceeds a set value, the interface means being connected to the circuit means.

2. A system as claimed in claim 1, wherein the interface means varies a characteristic of the indication signal in proportion to the detected magnitude of the magnetic field gradient to provide an indication of the magnitude of the magnetic field gradient.

3. A system as claimed in claim 2, wherein the interface means comprises a single transducer adapted to provide an indication signal for either polarity of the detected magnetic field, wherein the single transducer is activated to generate a first indication signal for one polarity and a second indication signal for the other polarity, to indicate the polarity of the magnetic field when the magnetic field gradient exceeds the set value.

4. A system as claimed in claim 3, wherein the first and second indication signals have respective first and second frequencies, different from one another to indicate the polarity.

5. A system as claimed in claim 4, wherein the interface means additionally provides an indication of the magnitude of the detected magnetic field gradient.

6. A system as claimed in claim 5, wherein the amplitude of the first and second indication signals is varied in proportion to the magnitude of the detected magnetic field gradient to provide an indication of the magnitude of the magnetic field gradient.

7. A system as claimed in claim 6, wherein the amplitude of the first and second indication signals is varied, to indicate the magnitude of the magnetic field gradient when the magnetic field gradient does not exceed the set value or when the magnetic field has one polarity, and when the magnetic field has the other polarity and has a magnitude exceeding the set value, an indication signal is given which varies in frequency to indicate the magnitude of the detected magnetic field gradient.

8. A system as claimed in claim 5, wherein the first and second indication signals are intermittent and oscillate between on and off states; the rate of oscillation being indicative of the magnitude of the detected magnetic field gradient.

9. A system as claimed in claim 5, wherein the transducer generates an audio output and the first and second indication signals comprise first and second audio frequencies, which indicate the magnitude of the detected magnetic field gradient by one of (i) varying the amplitude thereof and (ii) oscillation thereof between on and off states, the frequency of oscillation being indicative of the magnitude of the detected magnetic field gradient.

10. A system as claimed in claim 1, wherein the interface means is adapted to provide an indication that the magnitude of the detected magnetic field gradient exceeds the set value for either polarity, and wherein the interface means comprises one transducer for indicating the magnetic field gradient of one polarity and another transducer for indicating the magnetic field gradient of the other polarity, each transducer being activated to produce an indication signal, when the magnetic field has the required polarity and the magnetic field gradient exceeds the set value.

11. A system as claimed in claim 10, wherein the indication signals of the transducers are varied by one of (i) varying the amplitude thereof and (ii) oscillation thereof between on and off states, to provide an indication of the magnitude of the detected magnetic field gradient.

12. A system as claimed in claim 10, wherein the circuit means includes an auxiliary input, for a signal indicative of the polarity of the magnetic field at the first sensor, which auxiliary input is connected to the output of the first sensor.

13. A system as claimed in claim 12, wherein the circuit means includes comparison means having one input for a threshold level for one polarity and another input for a threshold level of the other polarity, a threshold comparator having an input connected to the output of the means for generating a difference signal and another input, and a decision block for selectively connecting the other input of the threshold comparator to one of said threshold inputs, the decision block being controlled by the auxiliary input to the circuit means.

14. A system as claimed in claim 13, wherein the circuit means includes an additional decision block connected to the output of the threshold comparator and to the transducers, which decision block is also controlled by the auxiliary input of the interface means, whereby the appropriate transducer is selected, depending upon the polarity of the signal from the first sensor.

15. A system as claimed in claim 14, wherein said one and other transducers comprise first and second illumination means for providing a visual indication of the magnetic field.

16. A system as claimed in claim 15, which includes oscillator means connected between the output of the means for generating a difference signal and at least one of the first and second illumination means, the oscillator means providing an oscillating signal for causing the transducer to oscillate between on and off states.

17. A system as claimed in claim 16, wherein the frequency of the oscillator varies depending upon the output of the means for generating a difference signal, whereby the magnitude of the detected magnetic field gradient is indicated by the rate of oscillation.

18. A system as claimed in claim 10, wherein the transducers comprise illumination means for providing a visual indication of the magnitude of the detected magnetic field gradient in excess of the set value, and wherein the system additionally includes means for indicating the magnitude of the detected magnetic field gradient.

19. A system as claimed in claim 18, wherein the means for indicating the magnitude of the detected magnetic field gradient comprises means for generating an audio signal, whose frequency is varied in dependence upon the magnetic field gradient.

20. A system as claimed in claim 19, which includes a comparison amplifier having a first input connected to the output of the means for generating the difference signal and a second input for a threshold signal, and means for generating a threshold value connected to the second input of the comparison amplifier.

21. A system as claimed in claim 20, which includes a qualification comparator having a first input connected to the output of the first sensor for receiving the output signal therefrom and a second input, and means for generating a qualification threshold connected to the second input of the qualification comparator, and wherein the system includes a decision block having an input connected to the output of the comparison amplifier and one output for one polarity connected to said one transducer and another output for the other polarity connected to said other transducer, the decision block being connected to and controlled by the qualification comparator, to connect the comparison amplifier through to the appropriate output of the decision block depending upon the detected polarity.

22. A system as claimed in claim 21, wherein the means for setting the threshold reference comprises means for setting a positive threshold reference and means for setting a negative threshold reference, and wherein the system further includes a further decision block connected to and controlled by the qualification comparator and having two inputs connected to the positive and negative threshold references and an output connected to the second input of the comparison amplifier.

* * * * *